United States Patent
Liao et al.

(10) Patent No.: US 7,778,379 B2
(45) Date of Patent: Aug. 17, 2010

(54) SHIFT REGISTER APPARATUS

(75) Inventors: Yi-Suei Liao, Kaohsiung (TW); Chien-Liang Chen, Changhua County (TW); Chen-Lun Chiu, Hsinchu County (TW); Hao-Chieh Lee, Hsinchu County (TW); Kuan-Yu Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 73 days.

(21) Appl. No.: 12/342,042

(22) Filed: Dec. 22, 2008

(65) Prior Publication Data
US 2010/0134234 A1 Jun. 3, 2010

(30) Foreign Application Priority Data
Dec. 1, 2008 (TW) ............... 97146618 A

(51) Int. Cl.
*G11C 19/00* (2006.01)
(52) U.S. Cl. ............... 377/64; 377/69; 377/70
(58) Field of Classification Search ............ 377/64, 377/68–71, 74
See application file for complete search history.

(56) References Cited

U.S. PATENT DOCUMENTS

| 5,517,542 | A | * | 5/1996 | Huq | .................... | 377/78 |
| 5,859,630 | A | * | 1/1999 | Huq | .................... | 345/100 |
| 6,556,646 | B1 | | 4/2003 | Yeo et al. | | |
| 6,845,140 | B2 | | 1/2005 | Moon et al. | | |
| 7,310,402 | B2 | * | 12/2007 | Wei et al. | .................... | 377/64 |
| 7,400,698 | B2 | * | 7/2008 | Chang et al. | .................. | 377/64 |
| 2005/0008114 | A1 | * | 1/2005 | Moon | .................... | 377/64 |
| 2007/0104307 | A1 | * | 5/2007 | Kim et al. | .................... | 377/64 |
| 2007/0127620 | A1 | * | 6/2007 | Moon et al. | .................. | 377/64 |

* cited by examiner

*Primary Examiner*—Tuan Lam
(74) *Attorney, Agent, or Firm*—Jianq Chyun IP Office

(57) ABSTRACT

A shift register apparatus is provided. The pull-down unit of each of the shift registers in the shift register apparatus is controlled by itself, previous, and next two shift registers to enhance the ability of pull-down and voltage regulating. Therefore, the circuit structure of each of the shift registers does not need to be designed a large compensation capacitor therein to substantially restrain the coupling noise effect caused by the clock signal, and thus permitting that each of the shift registers can be collocated with a small compensation capacitor to enhance the output capability thereof.

13 Claims, 3 Drawing Sheets

SHIFT REGISTER APPARATUS

CROSS-REFERENCE TO RELATED APPLICATION

This application claims the priority benefit of Taiwan application serial no. 97146618, filed on Dec. 1, 2008. The entirety of the above-mentioned patent application is hereby incorporated by reference herein and made a part of this specification.

BACKGROUND OF THE INVENTION

1. Field of the Invention

The present invention relates to a shift register apparatus, more particularly, to a shifter register apparatus capable of restraining the coupling noise.

2. Description of the Related Art

In recent years, with great advance in the fabricating techniques of opto-electronics and semiconductor devices, flat panel displays (FPDs) have been vigorously developed. Among the FPDs, a liquid crystal display (hereinafter "LCD") has become the mainstream display product due to its advantages of outstanding space utilization efficiency, low power consumption, free radiation, and low electrical field interference. Accordingly, the LCD developed by various manufacturers trend to be miniaturization and low cost.

To reduce the fabrication cost of the LCD, some manufacturers have directly fabricated a plurality of amorphous silicon (a-Si) shift registers on the glass substrate through an amorphous silicon (a-Si) process, so as to replace the conventional gate driver. Thereupon, to reduce the fabrication cost of the LCD can be achieved.

However, the stability of the output signals (i.e. the scan signal) of the circuits in the conventional a-Si shift registers is not good; and it is easily influenced by the coupling of the external clock signals to produce the large noise (it can be understood the coupling noise), thereby causing the wrong logic output. To reduce the effect caused by the coupling noise in conventional, a large compensation capacitor would be designed into the circuit structure of each a-Si shift register, but such would increase the layout area of the a-Si shift registers and reduce the output capability of the a-Si shift registers.

SUMMARY OF THE INVENTION

The present invention is directed to a shift register apparatus with both characteristics of restraining the coupling noise and high output capability.

The present invention provides a shift register apparatus including a plurality of shift registers connected in series, each of the shift registers includes a pull-up unit, a control unit and a pull-down unit.

In an exemplary embodiment of the present invention, the pull-up unit of the $i^{th}$ shift register correspondingly receives a clock signal and a first scan signal outputted from the $(i-1)^{th}$ shift register, and provides a pull-up signal accordingly and determines whether a second scan signal is outputted or not. The control unit of the $i^{th}$ shift register receives the clock signal and the pull-up signal, and outputs a second control signal accordingly.

The pull-down unit of the $i^{th}$ shift register is coupled to the pull-up unit and the control unit of the $i^{th}$ shift register and the control unit of the $(i-1)^{th}$ shift register, for receiving and controlled by the second control signal, a first control signal outputted from the control unit of the $(i-1)^{th}$ shift register, and a fourth scan signal outputted from the $(i+2)^{th}$ shift register. When the $i^{th}$ shift register does not output the second scan signal, the $i^{th}$ shift register stably outputs a reference voltage by the pull-down unit of the $i^{th}$ shift register, where i is a positive integer which is greater than or equal to 2.

In an exemplary embodiment of the present invention, the pull-up unit of the $i^{th}$ shift register includes a first transistor and a second transistor. A gate and a first drain/source of the first transistor are coupled to each other for receiving the first scan signal. A gate of the second transistor is coupled to a second drain/source of the first transistor; a first drain/source of the second transistor is used for receiving the clock signal, and a second drain/source of the second transistor is used for outputting the second scan signal.

In an exemplary embodiment of the present invention, the pull-up unit of the $i^{th}$ shift register further includes a capacitor having one terminal coupled to the gate of the second transistor, and another terminal thereof coupled to the second drain/source of the second transistor.

In an exemplary embodiment of the present invention, the control unit of the $i^{th}$ shift register includes a third through a sixth transistors. A gate and a first drain/source of the third transistor are coupled to each other for receiving the clock signal. A gate of the fourth transistor is used for receiving the pull-up signal; a first drain/source of the fourth transistor is coupled to a second drain/source of the third transistor, and a second drain/source of the fourth transistor is used for receiving the reference voltage.

A gate of the fifth transistor is coupled to the second drain/source of the third transistor; a first drain/source of the fifth transistor is coupled to the first drain/source of the third transistor, and a second drain/source of the fifth transistor is used for outputting the second control signal. A gate of the sixth transistor is used for receiving the pull-up signal; a first drain/source of the sixth transistor is coupled to the second drain/source of the fifth transistor, and a second drain/source of the sixth transistor is used for receiving the reference voltage.

In an exemplary embodiment of the present invention, the pull-down unit of the $i^{th}$ shift register includes a seventh through an eleventh transistors. A gate of the seventh transistor is used for receiving the second control signal; a first drain/source of the seventh transistor is coupled to the gate of the second transistor, and a second drain/source of the seventh transistor is used for receiving the reference voltage. A gate of the eighth transistor is used for receiving the second control signal; a first drain/source of the eighth transistor is coupled to the second drain/source of the second transistor, and a second drain/source of the eighth transistor is used for receiving the reference voltage.

A gate of the ninth transistor is used for receiving the fourth scan signal; a first drain/source of the ninth transistor is coupled to the gate of the second transistor, and a second drain/source of the ninth transistor is used for receiving the reference voltage. A gate of the tenth transistor is used for receiving the first control signal; a first drain/source of the tenth transistor is coupled to the gate of the second transistor, and a second drain/source of the tenth transistor is used for receiving the reference voltage. A gate of the eleventh transistor is used for receiving the first control signal; a first drain/source of the eleventh transistor is coupled to the second drain/source of the second transistor, and a second drain/source of the eleventh transistor is used for receiving the reference voltage.

In an exemplary embodiment of the present invention, the shift register apparatus further includes an initial control unit, coupled to the pull-down unit of the $1^{st}$ shift register, for receiving a start signal and the clock signal correspondingly received by the pull-up unit of the $n^{th}$ shift register, and outputting an initial control signal to the tenth and the eleventh transistors in the pull-down unit of the $1^{st}$ shift register, where n is a positive integer which is greater than or equal to 3.

In an exemplary embodiment of the present invention, the initial control unit includes a twelfth through a fifteenth transistors. A gate and a first drain/source of the twelfth transistor are coupled to each other for receiving the clock signal correspondingly received by the pull-up unit of the $n^{th}$ shift register. A gate of the thirteenth transistor is used for receiving the start signal; a first drain/source of the thirteenth transistor is coupled to a second drain/source of the twelfth transistor, and a second drain/source of the thirteenth transistor is used for receiving the reference voltage.

A gate of the fourteenth transistor is coupled to the second drain/source of the twelfth transistor; a first drain/source of the fourteenth transistor is coupled to the first drain/source of the twelfth transistor, and a second drain/source of the fourteenth transistor is used for outputting the initial control signal. A gate of the fifteenth transistor is used for receiving the start signal; a first drain/source of the fifteenth transistor is coupled to the second drain/source of the fourteenth transistor, and a second drain/source of the fifteenth transistor is used for receiving the reference voltage.

In an exemplary embodiment of the present invention, the first through the fifteenth transistors are an N-type transistor.

In an exemplary embodiment of the present invention, the shift register apparatus is suitable for directly disposing on a glass substrate of a display panel to drive a plurality of scan lines within the display panel.

In an exemplary embodiment of the present invention, the display panel at least comprises a liquid crystal display panel.

The pull-down unit of each of the shift registers in the shift register apparatus is controlled by itself, previous, and next two shift registers to enhance the ability of pull-down and voltage regulating. Therefore, the circuit structure of each of the shift registers does not need to be designed a large compensation capacitor therein (i.e. it does not need any extra layout area) to substantially restrain the coupling noise effect caused by the clock signal, and thus permitting that each of the shift registers can be collocated with a small compensation capacitor to enhance the output capability thereof.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
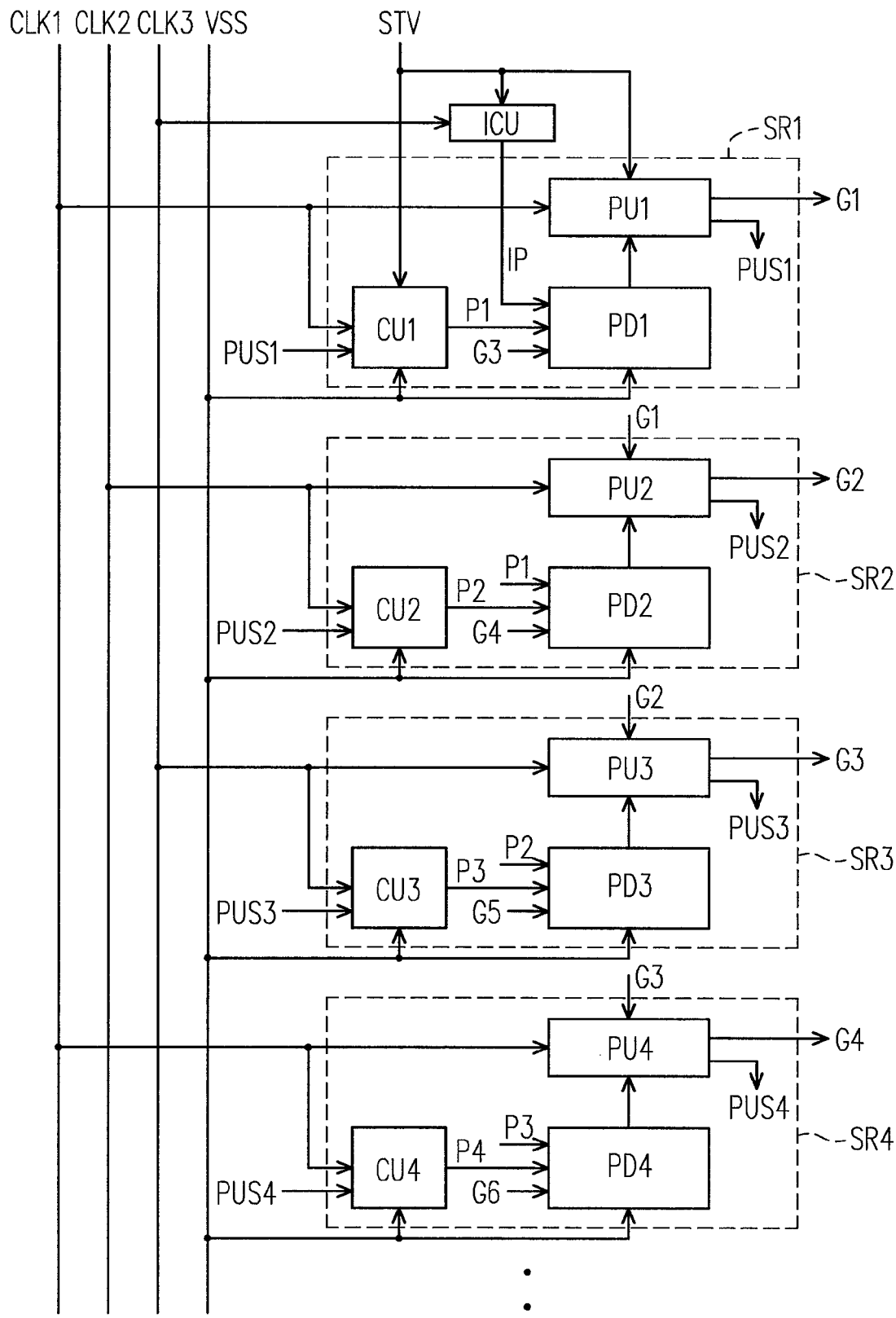
FIG. 1 is a block diagram of a shift register apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a shift register apparatus 100 according to an exemplary embodiment of the present invention. Referring to FIG. 1, the shift register apparatus 100 includes a plurality of shift registers SR1~SRn connected in series (FIG. 1 shows only four shift registers SR1~SR4 for explaining), and each of the shift registers SR1~SR4 includes a pull-up unit, a control unit and a pull-down unit respectively, namely, the shift register SR1 includes the pull-up unit PU1, the control unit CU1 and the pull-down unit PD1; the shift register SR2 includes the pull-up unit PU2, the control unit CU2 and the pull-down unit PD2; the shift register SR3 includes the pull-up unit PU3, the control unit CU3 and the pull-down unit PD3; and the shift register SR4 includes the pull-up unit PU4, the control unit CU4 and the pull-down unit PD4.

In the exemplary embodiment, the pull-up unit of the $i^{th}$ shift register correspondingly receives a clock signal and a first scan signal outputted from the $(i-1)^{th}$ shift register, and provides a pull-up signal accordingly and determines whether a second scan signal is outputted or not, where i is a positive integer which is greater than or equal to 2. The control unit of the $i^{th}$ shift register receives the clock signal and the pull-up signal, and outputs a second control signal accordingly.

The pull-down unit of the $i^{th}$ shift register is coupled to the pull-up unit and the control unit of the $i^{th}$ shift register and the control unit of the $(i-1)^{th}$ shift register, for receiving and controlled by the second control signal, a first control signal outputted from the control unit of the $(i-1)^{th}$ shift register, and a fourth scan signal outputted from the $(i+2)^{th}$ shift register. When the $i^{th}$ shift register does not output the second scan signal, the $i^{th}$ shift register stably outputs a reference voltage by the pull-down unit of the $i^{th}$ shift register.

For example, the pull-up unit PU2 of the $2^{nd}$ shift register SR2 correspondingly receives the clock signal CLK2 and the scan signal G1 outputted from the $1^{st}$ shift register SR1, and provides the pull-up signal PUS2 accordingly and determines whether the scan signal G2 is outputted or not. The control unit CU2 of the $2^{nd}$ shift register SR2 receives the clock signal CLK2 and the pull-up signal PUS2, and outputs the control signal P2 accordingly.

The pull-down unit PD2 of the $2^{nd}$ shift register SR2 is coupled to its pull-up unit PU2 and its control unit CU2 and the control unit CU1 of the $1^{st}$ shift register SR1, for receiving and controlled by the control signal P2, the control signal P1 outputted from the control unit CU1 of the $1^{st}$ shift register SR1, and the scan signal G4 outputted from the $4^{th}$ shift register SR4. When the $2^{nd}$ shift register SR2 does not output the scan signal G2, the $2^{nd}$ shift register SR2 stably outputs the reference voltage VSS by the pull-down unit PD2 of the $2^{nd}$ shift register SR2.

Herein, since one person having ordinary skilled in the art should be easily deduced/analogized the connection of the rest shift registers, so it would not be described in detail herein. Even for explaining to one person having ordinary skilled in the art understanding that how the $2^{nd}$ shift register SR2 does not output the scan signal G2, the $2^{nd}$ shift register SR2 would stably output the reference voltage VSS by the pull-down unit PD2 of the $2^{nd}$ shift register SR2. Below, the circuit structure and the operation principle of the single $2^{nd}$ shift register SR2 would be described, and the circuit structure and the operation principle of the rest shift registers are similar to the $2^{nd}$ shift register SR2.

Figure 2:
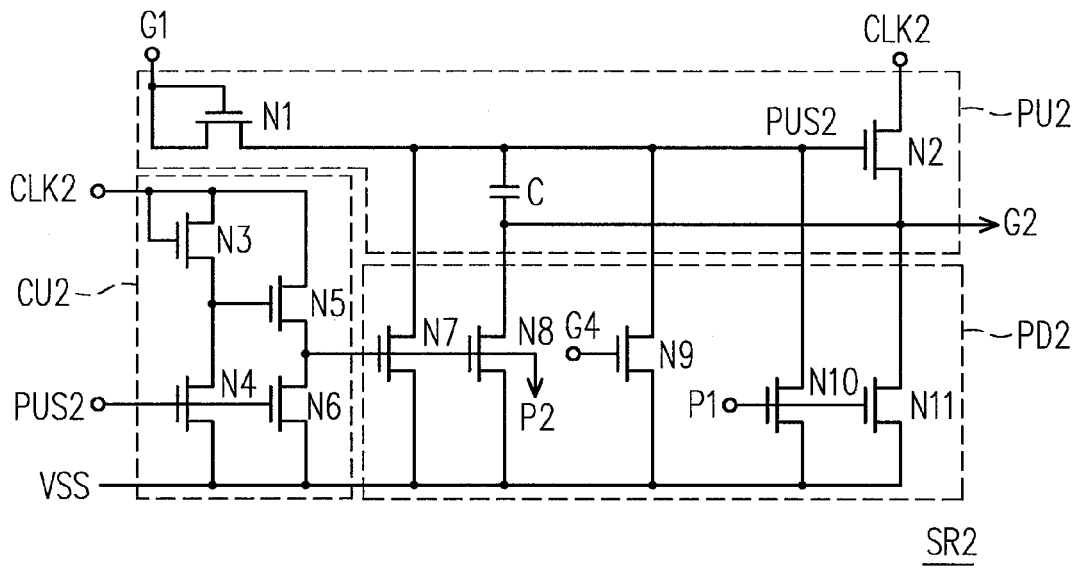
FIG. 2 is a circuit diagram of the $2^{nd}$ shift register according to an exemplary embodiment of the present invention.

FIG. 2 is a circuit diagram of the $2^{nd}$ shift register according to an exemplary embodiment of the present invention. Referring to FIG. 1 and FIG. 2, from the above, it can be known that the shift register SR2 includes the pull-up unit PU2, the control unit CU2 and the pull-down unit PD2. The pull-up unit PU2 includes N-type transistors N1 and N2, and a capacitor C (i.e. the compensation capacitor). A gate and a first drain/source of the N-type transistor N1 are coupled to each other for receiving the scan signal G1 outputted from the $1^{st}$ shift register SR1.

A gate of the N-type transistor N2 is coupled to a second drain/source of the N-type transistor N1; a first drain/source of the N-type transistor N2 is used for receiving the clock signal CLK2, and a second drain/source of the N-type transistor N2 is used for outputting the scan signal G2, wherein the signal on the gate of the N-type transistor N2 and the second drain/source of the N-type transistor N1 is the pull-up signal PU2. One terminal of the capacitor C is coupled to the gate of the N-type transistor N2, and another terminal of the capacitor C is coupled to the second drain/source of the N-type transistor N2.

The control unit CU2 includes N-type transistor N3~N6. A gate and a first drain/source of the N-type transistor N3 are coupled to each other for receiving the clock signal CLK2. A gate of the N-type transistor N4 is used for receiving the pull-up signal PUS2; a first drain/source of the N-type transistor N4 is coupled to a second drain/source of the N-type transistor N3, and a second drain/source of the N-type transistor N4 is used for receiving the reference voltage VSS.

A gate of the N-type transistor N5 is coupled to the second drain/source of the N-type transistor N3; a first drain/source of the N-type transistor N5 is coupled to the first drain/source of the N-type transistor N3, and a second drain/source of the N-type transistor N5 is used for outputting the control signal P2. A gate of the N-type transistor N6 is used for receiving the pull-up signal PUS2; a first drain/source of the N-type transistor N6 is coupled to the second drain/source of the N-type transistor N5, and a second drain/source of the N-type transistor N6 is used for receiving the reference voltage VSS.

The pull-down unit PD2 includes N-type transistors N7~11. A gate of the N-type transistor N7 is used for receiving the control signal P2; a first drain/source of the N-type transistor N7 is coupled to the gate of the N-type transistor N2, and a second drain/source of the N-type transistor N7 is used for receiving the reference voltage VSS. A gate of the N-type transistor N8 is used for receiving the control signal P2; a first drain/source of the N-type transistor N8 is coupled to the second drain/source of the N-type transistor N2, and a second drain/source of the N-type transistor N8 is used for receiving the reference voltage VSS. A gate of the N-type transistor N9 is used for receiving the scan signal G4 outputted from the $4^{th}$ shift register SR4; a first drain/source of the N-type transistor N9 is coupled to the gate of the N-type transistor N2, and a second drain/source of the N-type transistor N9 is used for receiving the reference voltage VSS.

A gate of the N-type transistor N10 is used for receiving the control signal P1 outputted from the control unit CU1 of the $1^{st}$ shift register SR1; a first drain/source of the N-type transistor N10 is coupled to the gate of the N-type transistor N2, and a second drain/source of the N-type transistor N10 is used for receiving the reference voltage VSS. A gate of the N-type transistor N11 is used for receiving the control signal P1 outputted from the control unit CU1 of the $1^{st}$ shift register SR1; a first drain/source of the N-type transistor N11 is coupled to the second drain/source of the N-type transistor N2, and a second drain/source of the N-type transistor N11 is used for receiving the reference voltage VSS.

Figure 3:
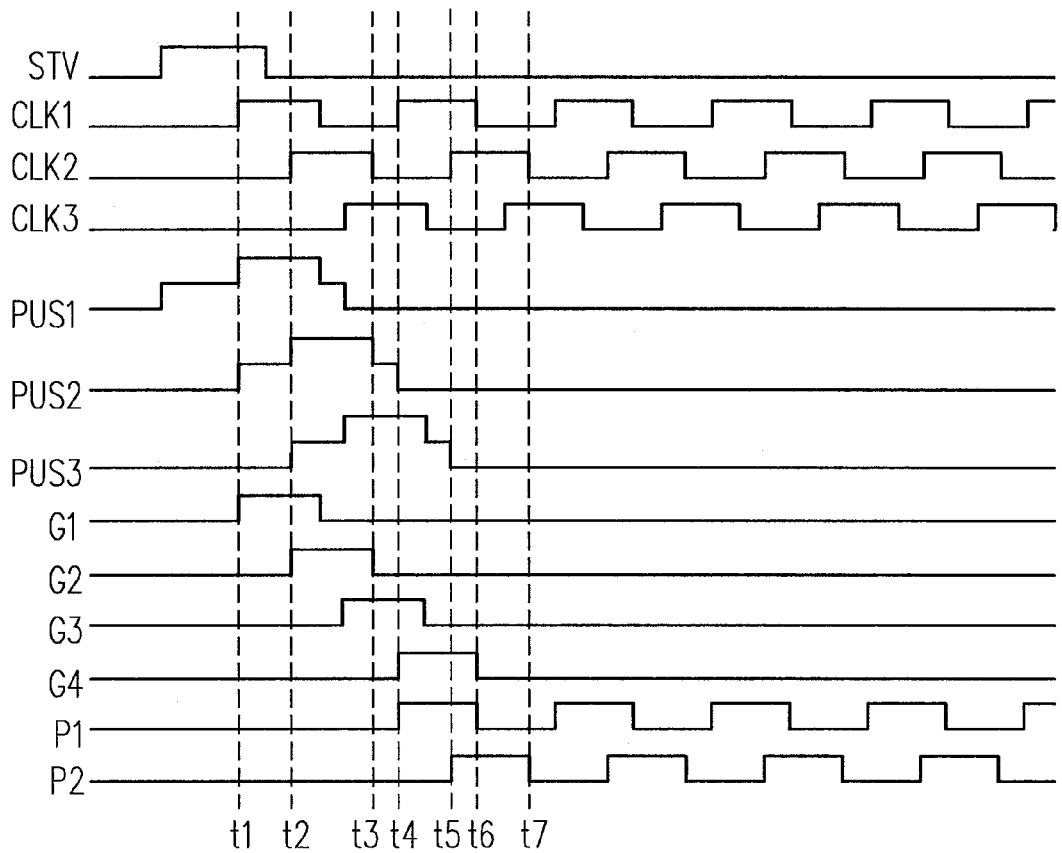
FIG. 3 is an operation timing chart of the $2^{nd}$ shift register according to an exemplary embodiment of the present invention.

FIG. 3 is an operation timing chart of the $2^{nd}$ shift register according to an exemplary embodiment of the present invention. Referring to FIG. 1 through FIG. 3, it can be clearly seen that when the gate and the first drain/source of the N-type transistor N1 of the pull-up unit PU2 receives the scan signal G1 outputted from the $1^{st}$ shift register SR1 at the time t1, the pull-up signal PUS2 provided by the pull-up unit PU2 would be pre-charged, so as to turn on the N-type transistors N4 and N6 of the control unit CU2.

Accordingly, when the clock signal CLK2 is enabled at time t2 through t3, the second drain/source of the N-type transistor N2 of the pull-up unit PU2 would output the scan signal G2. Next, when the $4^{th}$ shift register SR4 outputs the scan signal G4 at the time t4, the pull-up signal PUS2 provided by the pull-up unit PU2 would be pulled-down to the reference voltage VSS, and thus turning off the N-type transistor N2 of the pull-up unit PU2 and the N-type transistors N4 and N6 of the control unit CU2, so as to make the $2^{nd}$ shift register SR2 output the reference voltage VSS.

In an another aspect, since the clock signal CLK1 would be enabled at the time t4 through t6, so that the control unit CU1 of the $1^{st}$ shift register SR1 would provide the control signal P1 to the gates of the N-type transistors N10 and N11 of the pull-down unit PD2, and thus turning on the N-type transistors N10 and N11 of the pull-down unit PD2. Thereafter, when the clock signal CLK2 is enabled at the time t5 through t7, the control unit CU2 would provide the control signal P2 to turn on the N-type transistors N7 and N8 of the pull-down unit PD2.

Accordingly, when the $2^{nd}$ shift register SR2 should not output the scan signal G2, the coupling noise of the clock signal CLK2 would be released/discharged to the reference voltage VSS. In addition, after the time t7, the coupling noise caused whenever the clock signal CLK2 enabling would also be released/discharged to the reference voltage VSS. Therefore, the coupling noise caused by the clock signal CLK2 would not influence the output logic state of the scan signal G2; such that a large capacitor C would not be designed into the $2^{nd}$ shift register SR2 (i.e. it does not need any extra layout area) to restrain the coupling noise, the $2^{nd}$ shift register SR2 could correctly output the scan signal G2.

Herein, even though the above exemplary embodiment merely describe the circuit structure and the operation principle of the $2^{nd}$ shift register SR2, but the circuit structure and the operation principle of the rest shift registers are similar to the $2^{nd}$ shift register SR2, so that it would not be described in detail herein.

Furthermore, since there is no previous shift register to provide the control signal to the N-type transistors N10 and N11 of the pull-down unit PD1 of the $1^{st}$ shift register SR1. Therefore, in the exemplary embodiment, the shift register apparatus 100 further includes an initial control unit ICU, which is coupled to the pull-down unit PD1 of the $1^{st}$ shift register SR1, for receiving a start signal STV and the clock signal CLK3 received by the pull-up unit PU3 of the $3^{rd}$ shift register SR3, and outputting an initial control signal IP to the N-type transistors N10 and N11 in the pull-down unit PD1 of the $1^{st}$ shift register SR1.

Figure 4:
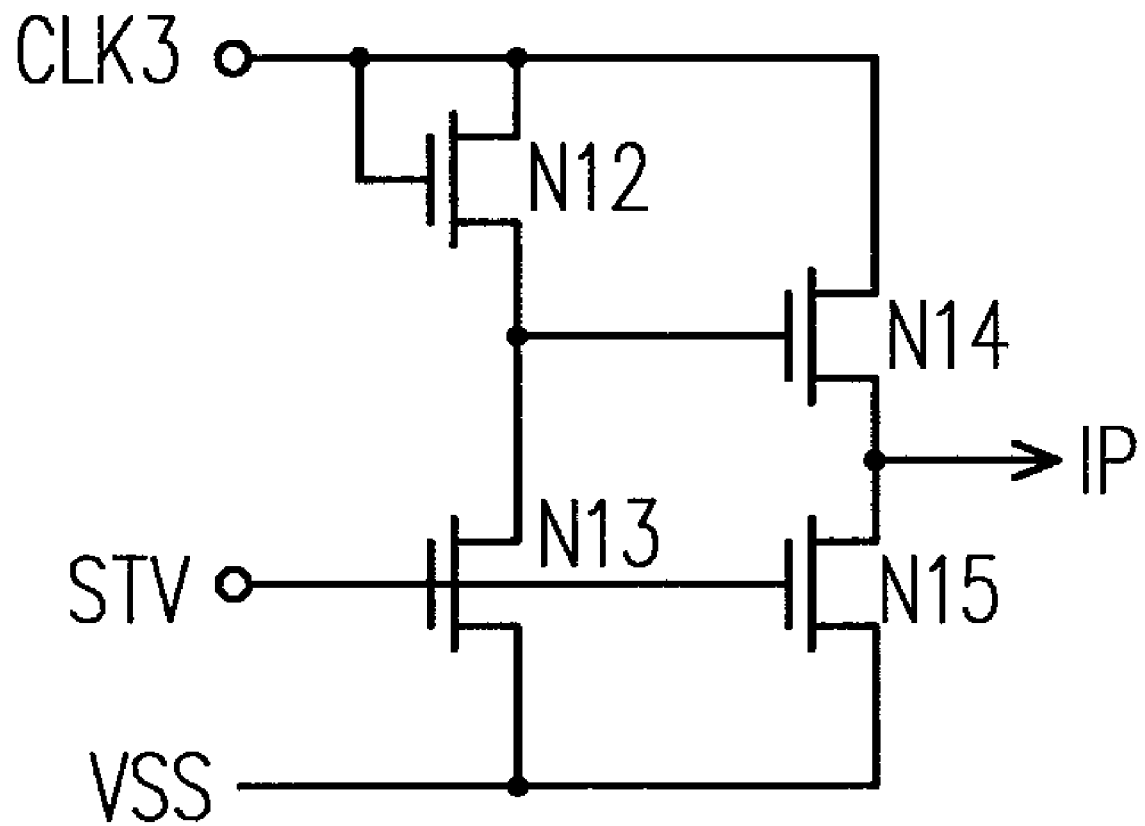
FIG. 4 is a circuit diagram of an initial control unit according to an exemplary embodiment of the present invention.

FIG. 4 is a circuit diagram of an initial control unit according to an exemplary embodiment of the present invention. Referring to FIG. 1 through FIG. 4, in the exemplary embodiment, the initial control unit ICU includes N-type transistors N12~N15. A gate and a first drain/source of the N-type transistor N12 are coupled to each other for receiving the clock signal CLK3 received by the pull-up unit PU3 of the 3$^{rd}$ shift register SR3. A gate of the N-type transistor N13 is used for receiving the start signal STV; a first drain/source of the N-type transistor N13 is coupled to a second drain/source of the N-type transistor N12, and a second drain/source of the N-type transistor N13 is used for receiving the reference voltage VSS.

A gate of the N-type transistor N14 is coupled to the second drain/source of the N-type transistor N12; a first drain/source of the N-type transistor N14 is coupled to the first drain/source of the N-type transistor N12, and a second drain/source of the N-type transistor N14 is used for outputting the initial control signal IP. A gate of the N-type transistor N15 is used for receiving the start signal STV; a first drain/source of the N-type transistor N15 is coupled to the second drain/source of the N-type transistor N14, and a second drain/source of the N-type transistor N15 is used for receiving the reference voltage VSS. In the exemplary embodiment, the operation principle of the initial control unit ICU is similar to the control unit CU2, so it would not be described in detail herein.

Besides, three clock signals CLK1~CLK3 are implemented by all of the above exemplary embodiments, but other exemplary embodiments of the present invention could be implemented by three more clock signals, such as four clock signals. To be specific, it can be clearly seen from FIG. 1, every three shift registers (for example, SR1~SR3, SR4~SR6, . . . , etc.) would circularly receive the clock signals CLK1~CLK3, but in the other exemplary embodiments of the present invention, it could be every four shift registers (for example, SR1~SR4, SR5~SR8, . . . , etc.) circularly receiving four clock signals, all determined by the particularly design requirements.

Furthermore, it should be noted that if every four shift registers circularly receives four clock signals, then the gate and the first drain/source of the N-type transistor N12 in the initial control unit ICU must be receiving the 4$^{th}$ clock signal rather than receiving the 3$^{rd}$ clock signal CLK3 in the above-mentioned exemplary embodiments.

In summary, The pull-down unit of each of the shift registers in the shift register apparatus is controlled by itself, previous, and next two shift registers to enhance the ability of pull-down and voltage regulating. Therefore, the circuit structure of each of the shift registers does not need to be designed a large compensation capacitor therein (i.e. it does not need any extra layout area) to substantially restrain the coupling noise effect caused by the clock signal, and thus permitting that each of the shift registers can be collocated with a small compensation capacitor to enhance the output capability thereof.

In addition, since each shift register in the present shift register apparatus has the capable of good restraining coupling noise and high output capability. Therefore, the present shift register apparatus is suitable for directly disposing on a glass substrate of a display panel (for example, the liquid crystal display panel, LCD panel) to drive a plurality of scan lines within the display panel. However, according to the spirit of the present invention, the present shift register apparatus could be applied in any one electronic device which needs to implement the shift register mechanism therein, so the application of the present shift register apparatus should not be limited to the liquid crystal display device.

Furthermore, under a condition that the process factor is permitted, each shift register in the above exemplary embodiments could be implemented by the P-type transistors, and such various exemplary embodiments would fall in the scope of the present invention. Moreover, it will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register apparatus, comprising:
a plurality of shift registers connected in series, each of the shift registers comprising a pull-up unit, a control unit and a pull-down, wherein:
the pull-up unit of the i$^{th}$ shift register correspondingly receives a clock signal and a first scan signal outputted from the (i−1)$^{th}$ shift register, and provides a pull-up signal accordingly and determines whether a second scan signal is outputted or not;
the control unit of the i$^{th}$ shift register receives the clock signal and the pull-up signal, and outputs a second control signal accordingly; and
the pull-down unit of the i$^{th}$ shift register is coupled to the pull-up unit and the control unit of the i$^{th}$ shift register and the control unit of the (i−1)$^{th}$ shift register, for receiving and controlled by the second control signal, a first control signal outputted from the control unit of the (i−1)$^{th}$ shift register, and a fourth scan signal outputted from the (i+2)$^{th}$ shift register, wherein when the i$^{th}$ shift register does not output the second scan signal, the i$^{th}$ shift register stably outputs a reference voltage by the pull-down unit of the i$^{th}$ shift register, where i is a positive integer which is greater than or equal to 2.

2. The shift register apparatus according to claim 1, wherein the pull-up unit of the i$^{th}$ shift register comprises:
a first transistor, having a gate and a first drain/source both coupled to each other for receiving the first scan signal;
a second transistor, having a gate coupled to a second drain/source of the first transistor, a first drain/source receiving the clock signal, and a second drain/source outputting the second scan signal.

3. The shift register apparatus according to claim 2, wherein the pull-up unit of the i$^{th}$ shift register further comprises:
a capacitor, having one terminal coupled to the gate of the second transistor, and another terminal thereof coupled to the second drain/source of the second transistor.

4. The shift register apparatus according to claim 2, wherein the first and the second transistors are an N-type transistor.

5. The shift register apparatus according to claim 2, wherein the control unit of the i$^{th}$ shift register comprises:
a third transistor, having a gate and a first drain/source both coupled to each other for receiving the clock signal;
a fourth transistor, having a gate receiving the pull-up signal, a first drain/source coupled to a second drain/source of the third transistor, and a second drain/source receiving the reference voltage;
a fifth transistor, having a gate coupled to the second drain/source of the third transistor, a first drain/source coupled to the first drain/source of the third transistor, and a second drain/source outputting the second control signal; and
a sixth transistor, having a gate receiving the pull-up signal, a first drain/source coupled to the second drain/source of the fifth transistor, and a second drain/source receiving the reference voltage.

6. The shift register apparatus according to claim 5, wherein the third through the sixth transistors are an N-type transistor.

7. The shift register apparatus according to claim 5, wherein the pull-down unit of the $i^{th}$ shift register comprises:
- a seventh transistor, having a gate receiving the second control signal, a first drain/source coupled to the gate of the second transistor, and a second drain/source receiving the reference voltage;
- an eighth transistor, having a gate receiving the second control signal, a first drain/source coupled to the second drain/source of the second transistor, and a second drain/source receiving the reference voltage;
- a ninth transistor, having a gate receiving the fourth scan signal, a first drain/source coupled to the gate of the second transistor, and a second drain/source receiving the reference voltage;
- a tenth transistor, having a gate receiving the first control signal, a first drain/source coupled to the gate of the second transistor, and a second drain/source receiving the reference voltage; and
- an eleventh transistor, having a gate receiving the first control signal, a first drain/source coupled to the second drain/source of the second transistor, and a second drain/source receiving the reference voltage.

8. The shift register apparatus according to claim 7, wherein the seventh through the eleventh transistors are an N-type transistor.

9. The shift register apparatus according to claim 7, further comprising:
- an initial control unit, coupled to the pull-down unit of the $1^{st}$ shift register, for receiving a start signal and the clock signal correspondingly received by the pull-up unit of the $n^{th}$ shift register, and outputting an initial control signal to the tenth and the eleventh transistors in the pull-down unit of the $1^{st}$ shift register, where n is a positive integer which is greater than or equal to 3.

10. The shift register apparatus according to claim 9, wherein the initial control unit comprises:
- a twelfth transistor, having a gate and a first drain/source both coupled to each other for receiving the clock signal correspondingly received by the pull-up unit of the $n^{th}$ shift register;
- a thirteenth transistor, having a gate receiving the start signal, a first drain/source coupled to a second drain/source of the twelfth transistor, and a second drain/source receiving the reference voltage;
- a fourteenth transistor, having a gate coupled to the second drain/source of the twelfth transistor, a first drain/source coupled to the first drain/source of the twelfth transistor, and a second drain/source outputting the initial control signal; and
- a fifteenth transistor, having a gate receiving the start signal, a first drain/source coupled to the second drain/source of the fourteenth transistor, and a second drain/source receiving the reference voltage.

11. The shift register apparatus according to claim 10, wherein the twelfth through the fifteenth transistors are an N-type transistor.

12. The shift register apparatus according to claim 10, wherein the shift register apparatus is suitable for directly disposing on a glass substrate of a display panel to drive a plurality of scan lines within the display panel.

13. The shift register apparatus according to claim 12, wherein the display panel at least comprises a liquid crystal display panel.

* * * * *